United States Patent
Kumagai et al.

(10) Patent No.: US 10,211,387 B2
(45) Date of Patent: Feb. 19, 2019

(54) METHOD FOR CONTROLLING ULTRASONIC MOTOR AND SURVEYING INSTRUMENT FOR THE SAME

(71) Applicant: TOPCON CORPORATION, Tokyo (JP)

(72) Inventors: Kaoru Kumagai, Tokyo (JP); Satoshi Yanobe, Tokyo (JP); Tetsutaro Kouji, Tokyo (JP)

(73) Assignee: TOPCON CORPORATION, Tokyo (JP)

( * ) Notice: Subject to any disclaimer, the term of this patent is extended or adjusted under 35 U.S.C. 154(b) by 0 days.

(21) Appl. No.: 15/463,920

(22) Filed: Mar. 20, 2017

(65) Prior Publication Data
US 2017/0309806 A1 Oct. 26, 2017

(30) Foreign Application Priority Data
Apr. 26, 2016 (JP) ................. 2016-087805

(51) Int. Cl.
*H02P 23/20* (2016.01)
*H01L 41/04* (2006.01)
(Continued)

(52) U.S. Cl.
CPC .......... *H01L 41/042* (2013.01); *B06B 1/0644* (2013.01); *G01C 3/08* (2013.01);
(Continued)

(58) Field of Classification Search
CPC ...... H02P 23/20; H02P 2209/09; H02P 23/22; H02P 27/08
See application file for complete search history.

(56) References Cited

U.S. PATENT DOCUMENTS 3,838,325 A * 9/1974 Kobayashi ........... G05B 19/416
388/844
3,886,459 A * 5/1975 Hufford ................. G05B 19/40
318/696
(Continued)

FOREIGN PATENT DOCUMENTS

| DE | 202014008041 U1 | 11/2014 |
|---|---|---|
| EP | 2759801 A2 | 7/2014 |
| JP | 63110971 A | 5/1988 |
| JP | 2014-137299 A | 7/2014 |

*Primary Examiner* — Bickey Dhakal
(74) *Attorney, Agent, or Firm* — Roberts Mlotkowski Safran Cole & Calderon, P.C.

(57) ABSTRACT

Provided is a method for controlling an ultrasonic motor to reduce noise sounding during low-speed rotation in a surveying instrument adopting the ultrasonic motor for a rotary shaft, and a surveying instrument for the same. In a method for controlling an ultrasonic motor according to an aspect of the present invention, in a low-speed rotation range of an ultrasonic motor, a ratio of an acceleration period as a time of application of the drive signal in a control cycle is controlled, and a time to start the acceleration period is randomly shifted for each control cycle. In a method for controlling an ultrasonic motor according to another aspect, a time to start the acceleration period is regularly shifted for each control cycle. In a method for controlling an ultrasonic motor according to still another aspect, second-half acceleration control and first-half acceleration control are alternately repeated.

5 Claims, 8 Drawing Sheets

(51) Int. Cl.
    *B06B 1/06*          (2006.01)
    *G01C 3/08*          (2006.01)
    *G01D 5/347*        (2006.01)
    *G01S 3/786*        (2006.01)
    *H01L 41/09*        (2006.01)
    *G01C 15/00*        (2006.01)
    *H02N 2/14*         (2006.01)
    *H02N 2/16*         (2006.01)

(52) U.S. Cl.
    CPC ......... *G01C 15/002* (2013.01); *G01D 5/3473* (2013.01); *G01S 3/786* (2013.01); *H01L 41/09* (2013.01); *H02N 2/142* (2013.01); *H02N 2/163* (2013.01)

(56) References Cited

U.S. PATENT DOCUMENTS

| | | | | |
|---|---|---|---|---|
| 4,297,628 | A * | 10/1981 | Hedges | H02P 23/26 318/778 |
| 4,330,817 | A * | 5/1982 | Avar | H02M 5/45 363/96 |
| 4,692,672 | A | 9/1987 | Okuno | |
| 6,433,507 | B1 * | 8/2002 | Makaran | H02P 7/29 318/599 |
| 6,621,559 | B1 * | 9/2003 | Kumagai | G01C 15/06 356/4.05 |
| 6,674,962 | B2 * | 1/2004 | Nadeau | H02P 7/29 388/800 |
| 2014/0196293 | A1 | 7/2014 | Kodaira et al. | |

\* cited by examiner

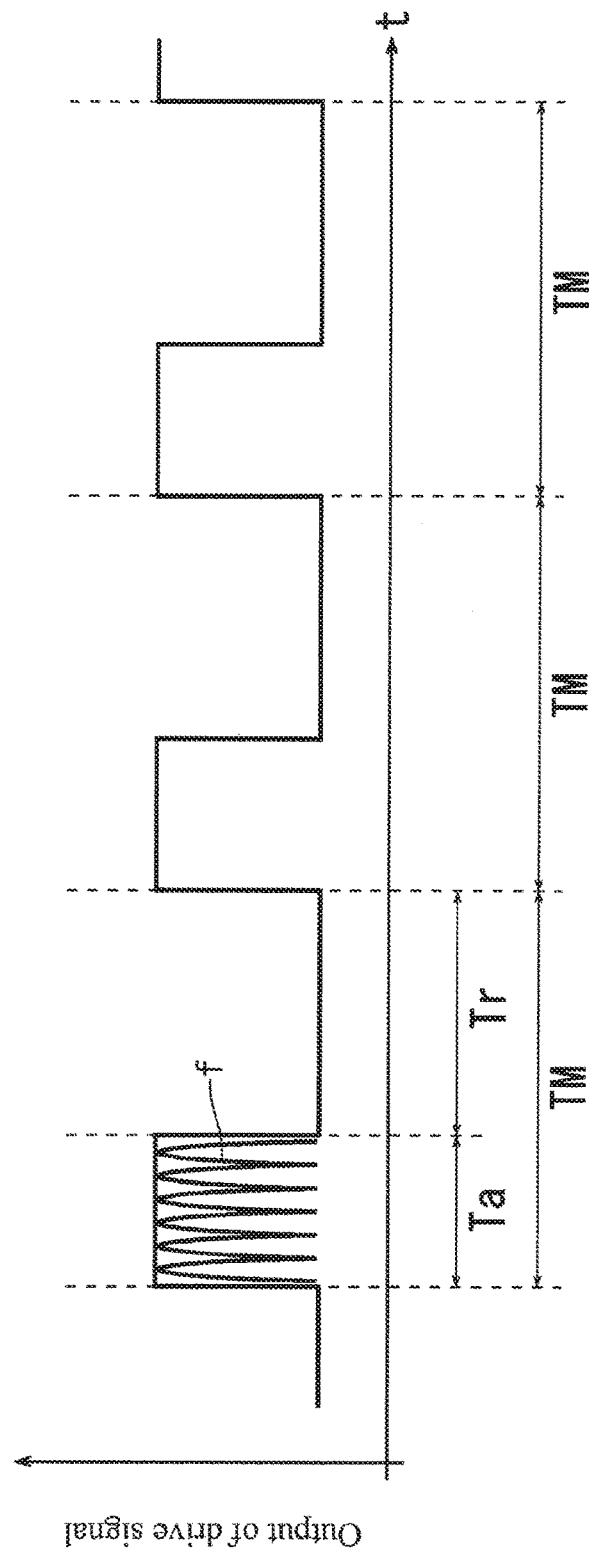

METHOD FOR CONTROLLING ULTRASONIC MOTOR AND SURVEYING INSTRUMENT FOR THE SAME

TECHNICAL FIELD

The present invention relates to a method for controlling an ultrasonic motor that drives a rotary shaft of a surveying instrument, and a surveying instrument for the same.

BACKGROUND ART

A surveying instrument, for example, a total station includes a telescope that collimates a measurement point, a bracket portion that supports the telescope rotatably in the vertical direction, and a base that supports the bracket portion rotatably in the horizontal direction. The telescope is driven by a vertical rotary motor provided on a vertical rotary shaft, and the bracket portion is driven by a horizontal rotary motor provided on a horizontal rotary shaft. Patent Document 1 discloses a surveying instrument adopting ultrasonic motors as the vertical rotary motor and the horizontal rotary motor.

CITATION LIST

Patent Document

[Patent Document 1] Japanese Published Unexamined Patent Application No. 2014-137299

SUMMARY OF THE INVENTION

Problems to be Solved by the Invention

Many surveying instruments have an automatic tracking mode for automatically tracking a moving target. In an automatic tracking mode, in order to track a target that an operator carries, low-speed rotation at approximately 5 [°/sec] is necessary. An ultrasonic motor hardly rotates at a low speed during continuous driving, and at the time of low-speed rotation, intermittent driving in which a drive signal is turned ON/OFF is performed as shown in FIG. 8. That is, in a predetermined control cycle TM, an acceleration period Ta in which a drive signal is applied and a deceleration period Tr in which the drive signal is stopped are provided, and by changing the ratio of the acceleration period Ta and the deceleration period Tr, an average speed in the control cycle TM is controlled.

However, when intermittent driving is performed, at a rise and a fall of the drive signal, that is, at the start and the end of the acceleration period Ta, abnormal noise sounds, and this is unpleasant to the ears as compared with the time of continuous driving.

In order to solve the above-described problem, an object of the present invention is to provide a method for controlling an ultrasonic motor to reduce noise sounding during low-speed rotation in a surveying instrument adopting the ultrasonic motor for a rotary shaft, and a surveying instrument for the same.

Means for Solving the Problems

In order to solve the above-described problem, a method for controlling an ultrasonic motor according to an aspect of the present invention is a method for controlling an ultrasonic motor that drives a rotary shaft of a surveying instrument in response to a drive signal, wherein in a low-speed rotation range of the ultrasonic motor, a ratio of an acceleration period as a time of application of the drive signal in a control cycle is controlled, and a time to start the acceleration period is randomly shifted for each control cycle.

A method for controlling an ultrasonic motor according to another aspect is a method for controlling an ultrasonic motor that drives a rotary shaft of a surveying instrument in response to a drive signal, wherein in a low-speed rotation range of the ultrasonic motor, a ratio of an acceleration period as a time of application of the drive signal in a control cycle is controlled, and a time to start the acceleration period is regularly shifted for each control cycle.

In the above-described aspect, it is also preferable that a certain time within the control cycle is set as a starting point and the time to start the acceleration period is shifted by a fixed time from the starting point for each control cycle.

In the above-described aspect, it is also preferable that 0th to k−1-th sections are set by dividing the control cycle by k (k is a natural number not less than 2), the time to start the acceleration period is set in any of the sections, and the section is regularly shifted for each control cycle.

A method for controlling an ultrasonic motor according to still another aspect is a method for controlling an ultrasonic motor that drives a rotary shaft of a surveying instrument in response to a drive signal, wherein in a low-speed rotation range of the ultrasonic motor, a ratio of an acceleration period as a time of application of the drive signal in a control cycle is controlled, and second-half acceleration control to end the acceleration period in each control cycle so that the acceleration period includes a terminal end of the control cycle, and first-half acceleration control to start the acceleration period so that the acceleration period includes a starting end of the control cycle, are alternately repeated.

A surveying instrument according to an aspect of the present invention includes a rotary shaft, an ultrasonic motor that drives the rotary shaft in response to a drive signal, an encoder that detects a rotation speed of the rotary shaft, and a control unit that executes any of the control methods described above.

Effect of the Invention

The present invention provides a method for controlling an ultrasonic motor to reduce noise sounding during low-speed rotation in a surveying instrument adopting the ultrasonic motor for a rotary shaft, and a surveying instrument for the same.

BRIEF DESCRIPTION OF THE DRAWINGS

FIG. 8 is a control image diagram in which an ultrasonic motor is intermittently driven.

BEST MODE FOR CARRYING OUT THE INVENTION

Next, a preferred embodiment of the present invention is described with reference to the drawings.

Figure 1:
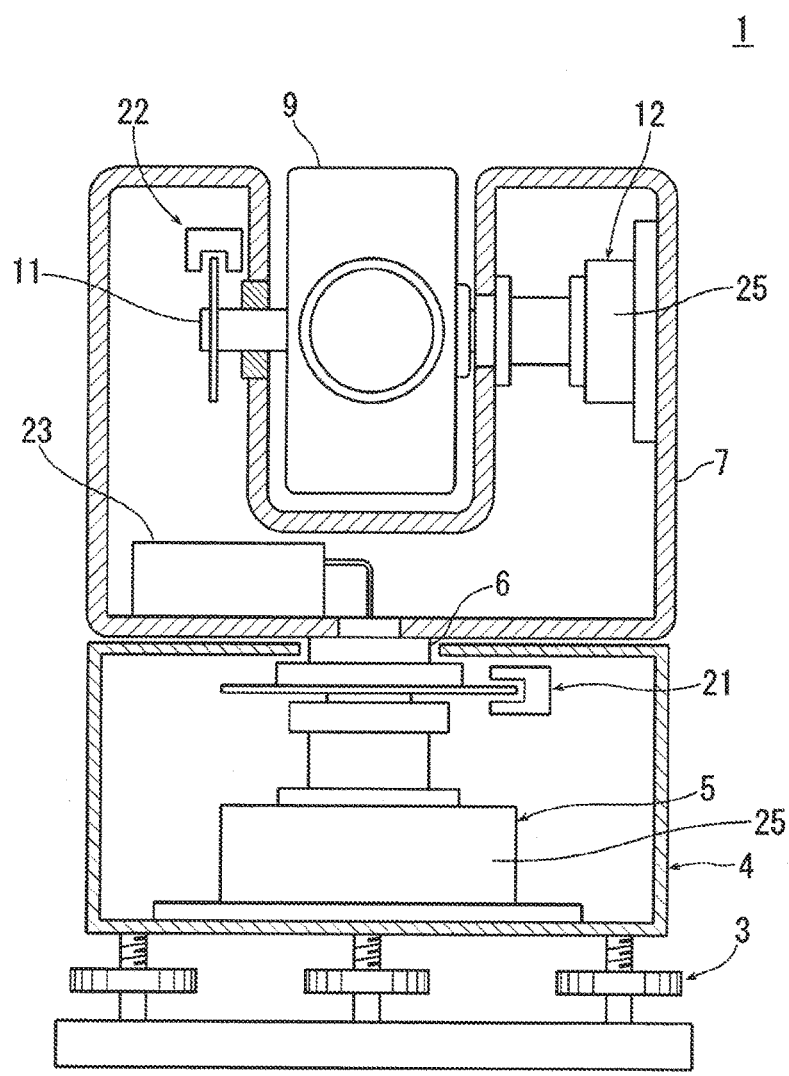
FIG. 1 is a schematic longitudinal sectional view of a surveying instrument according to the present embodiment.
Figure 2:
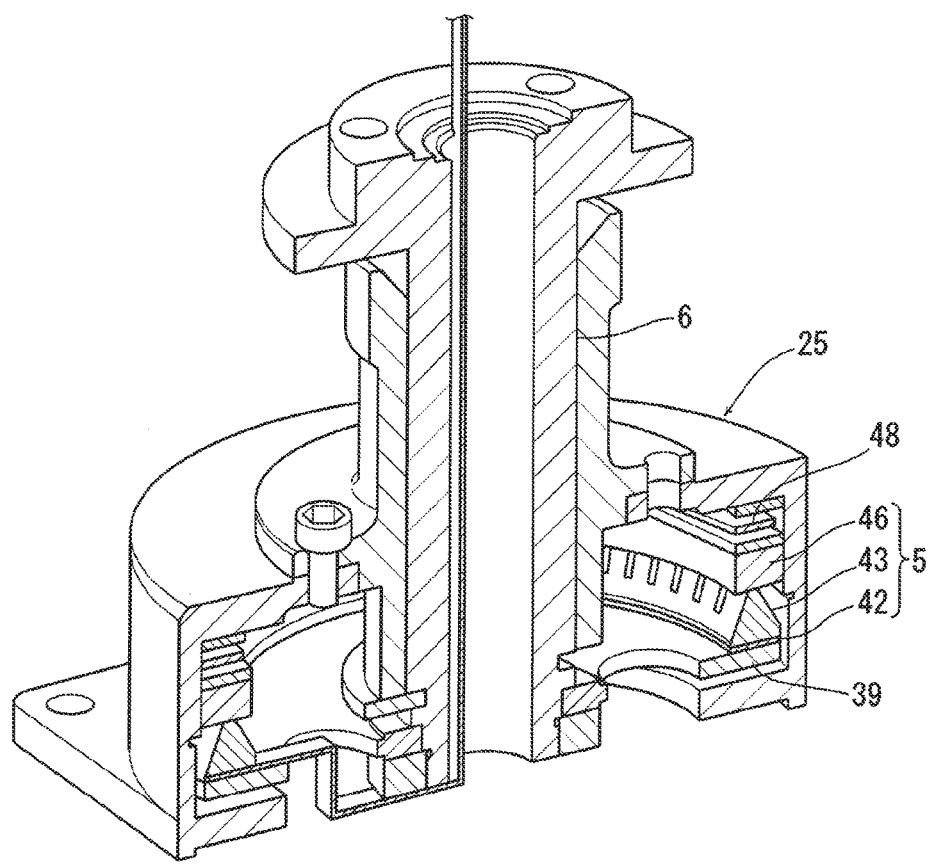
FIG. 2 is a sectional perspective view of a portion including an ultrasonic motor shown in FIG. 1.

FIG. 1 is a schematic longitudinal sectional view of a surveying instrument according to the present embodiment, and FIG. 2 is a sectional perspective view of a portion including an ultrasonic motor shown in FIG. 1. The reference numeral 1 denotes a surveying instrument, and the surveying instrument 1 includes a base 4 provided on a leveling portion 3, a bracket portion 7 that rotates horizontally around a horizontal rotary shaft 6 on the base 4, and a telescope 9 that is supported by the bracket portion 7 and rotates vertically around a vertical rotary shaft 11. In the bracket portion 7, a control unit 23 is housed. The surveying instrument 1 has an automatic collimation function and an automatic tracking function, and the telescope 9 houses a range-finding optical system and a tracking optical system that are not shown. Configurations of the range-finding optical system and the tracking optical system may be equivalent to those of conventional technologies, so that description thereof is omitted. In the surveying instrument 1, range-finding light and tracking light are irradiated onto a target by collaboration between horizontal rotation of the bracket portion 7 and vertical rotation of the telescope 9.

At a lower end portion of the horizontal rotary shaft 6, an ultrasonic motor 5 for horizontal rotation is provided, and at an upper end portion, an encoder 21 to detect a horizontal angle is provided. At one end portion of the vertical rotary shaft 11, an ultrasonic motor 12 for vertical rotation is provided, and at the other end portion, an encoder 22 to detect a vertical angle is provided. The encoders 21 and 22 are absolute encoders each including a rotary disc, a slit, a light emitting diode, and an image sensor. Other than absolute encoders, incremental encoders may be used.

Concerning configurations of the ultrasonic motors 5 and 12, configurations for vertical rotation and horizontal rotation are equivalent to each other, so that a configuration for horizontal rotation is mainly described. The ultrasonic motor 5 includes, in a ring form, in order from a base portion 39, a piezoelectric ceramic 42 that generates vibration, a stator 43 that amplifies vibration, a rotor 46 that interferes with the stator 43, and a wave washer 48 that presses the rotor 46 toward the stator 43 side. To the piezoelectric ceramic 42, a Sin electrode and a Cos electrode are attached, and when a drive voltage is alternately applied to these electrodes, the piezoelectric ceramic 42 ultrasonically vibrates. When the piezoelectric ceramic 42 vibrates, a wavelike traveling wave is formed in the stator 43, and due to friction caused by pressing of the wave washer 48, the stator 43 and the rotor 46 rotate relative to each other. As shown in FIG. 1, in the horizontal ultrasonic motor 5, a motor case 25 is fixed to the base 4 and a rotor 46 is fixed to the motor case 25, so that when the stator 43 rotates, the horizontal rotary shaft 6 rotates integrally with the stator 43 via the base portion 39. In the vertical ultrasonic motor 12, a stator 43 is fixed to a motor case 25, and when a rotor 46 rotates, the vertical rotary shaft 11 rotates integrally with the rotor 46.

Figure 3:
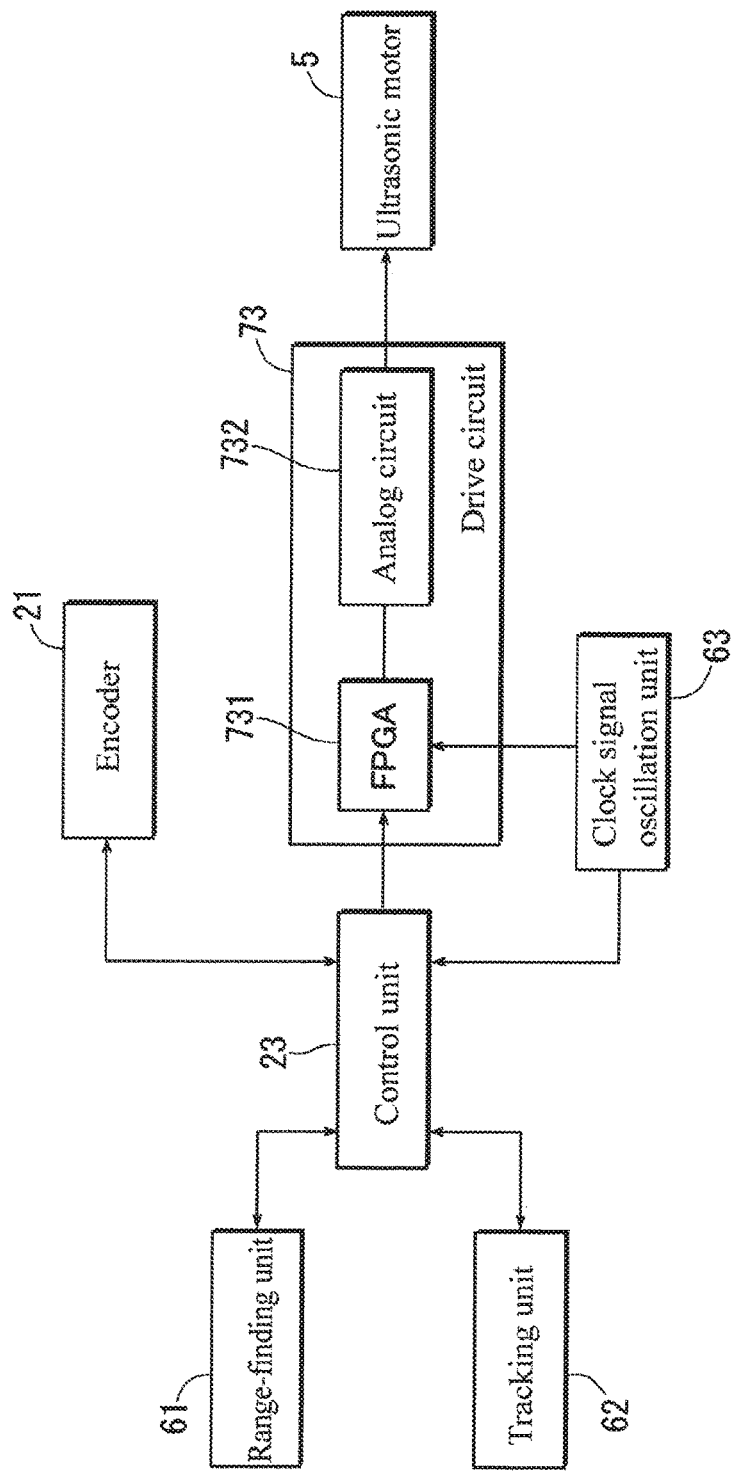
FIG. 3 is a control block diagram of the surveying instrument according to the present embodiment.

FIG. 3 is a control block diagram of the surveying instrument 1. Block diagrams of vertical rotation and horizontal rotation are equivalent to each other, so that the horizontal rotation is shown, and description on the vertical rotation is omitted. The surveying instrument 1 includes a control unit 23, an encoder 21, a range-finding unit 61, a tracking unit 62, a clock signal oscillation unit 63, a drive circuit 73, and the ultrasonic motor 5.

The control unit 23 is configured with a microcontroller including a CPU, a ROM, and a RAM, etc., mounted on an integrated circuit. Software of the control unit 23 is changeable from an external personal computer that is not shown. The control unit 23 successively obtains a rotation speed of the rotary shaft 6 from an angle signal of the encoder 21. In addition, the control unit outputs a drive signal to the ultrasonic motor 5 via the drive circuit 73. A waveform of this drive signal is described in detail below.

The range-finding unit 61 irradiates, under control by the control unit 23, a target with range-finding light by using the range-finding optical system, captures the target by light reflected thereon, and performs automatic collimation. When manual or automatic collimation is completed, the range-finding unit performs range-finding. The tracking unit 62 irradiates, under control by the control unit 23, a target with tracking light by using the tracking optical system and captures the target by light reflected thereon, and automatically tracks the target when the target moves.

The drive circuit 73 includes an FPGA (Field Programmable Gate Array) 731 and an analog circuit 732. Definition of an internal logic circuit of the FPGA 731 can be changed by the control unit 23 or an external device not shown. The FPGA 731 can generate a control signal at a variable drive frequency (drive signal frequency) and a variable amplitude, and can dynamically change the drive frequency and the amplitude. The analog circuit 732 includes a transformer, etc., and amplifies the control signal. The drive circuit 73 outputs the control signal from the FPGA 731 in response to a command from the control unit 23, and amplifies the control signal by the analog circuit 732 to generate two kinds of drive signals with different phases, and outputs these to the Sin electrode and the Cos electrode attached to the piezoelectric ceramic 42 of the ultrasonic motor 5. For the drive circuit 73, other PLDs (Programmable Logic Devices) such as an ASIC (Application Specific Integrated Circuit) may be used.

The clock signal oscillation unit 63 outputs a clock signal to the control unit 23 and the FPGA 731. The control unit 23 controls a light emitting cycle of the encoder 21 based on the clock signal. The FPGA 731 controls, based on the clock signal, the amplitude of the drive signal, the drive frequency f, and control cycles TM of the drive signal, and in a low-speed rotation range, controls a ratio of an acceleration period Ta (time of application of the drive signal) and a deceleration period Tr (time of stoppage of the drive signal) in the control cycle TM. In the present specification, the low-speed rotation range means a speed range in which the ultrasonic motor is not continuously driven to rotate. This low-speed rotation range differs among individual ultrasonic motors depending on the manufacturing states thereof, so that the low-speed rotation range is defined in advance in the control unit 23 by investigating the characteristics of the ultrasonic motor to be adopted.

By using the above-described configuration, the control unit 23 of the surveying instrument 1 controls the drive signal as follows in the low-speed rotation range of the ultrasonic motor 5. Although description on the vertical rotation is also omitted below, the same control as in the case of horizontal rotation is performed for the vertical rotation.

(First Control Method)

Figure 4:
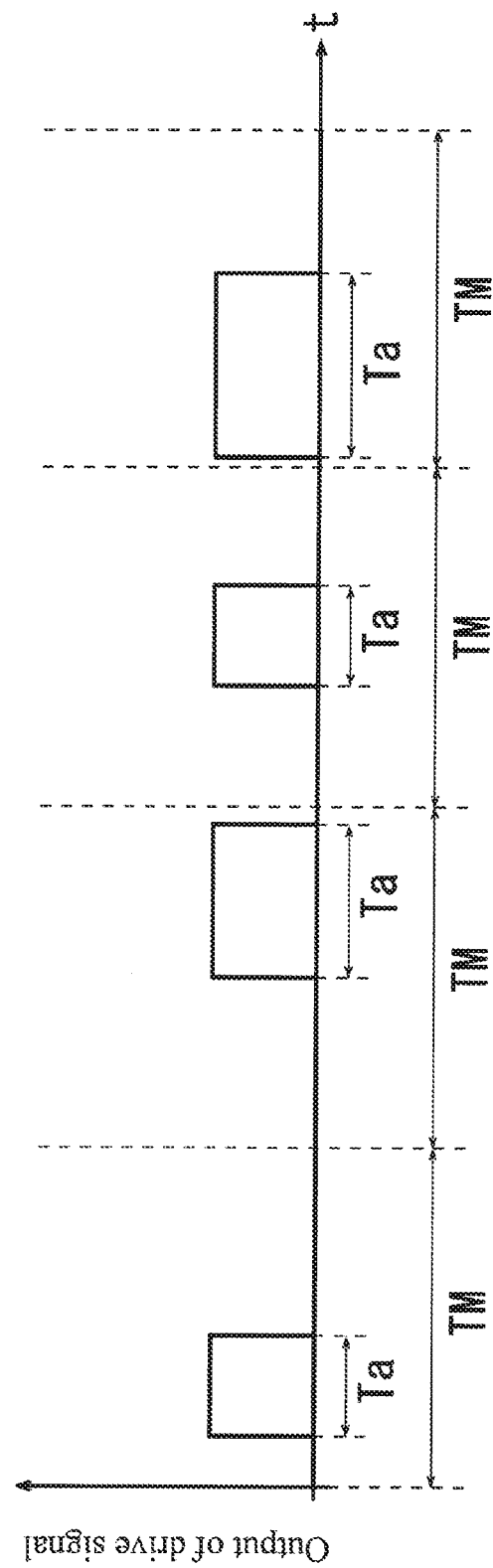
FIG. 4 is a waveform diagram of a drive signal of an ultrasonic motor according to a first control method.

FIG. 4 is a waveform diagram of a drive signal of the ultrasonic motor 5 according to a first control method. While referring to a rotation speed of the rotary shaft 6, the control unit 23 fixes control cycles TM of the ultrasonic motor 5 based on a clock signal from the clock signal oscillation unit 63 and changes a ratio of an acceleration period Ta in each control cycle TM (ratio of an acceleration period Ta and a deceleration period Tr, the acceleration period Ta is started once in the control cycle TM). Thereafter, the control unit 23 sets randomly a time to start the acceleration period Ta for each cycle. That is, the acceleration period Ta in the control cycle TM is started from a time different for each cycle based on the clock signal (for example, 1 pulse=1 μsec as a minimum unit).

As in a conventional case, that is, as shown in FIG. 8, when the acceleration period Ta is started from the same time in each cycle, for example, when the control cycle TM=4 msec, a spectrum with a frequency of 250 kHz equivalent to 4 msec and its harmonics of 500 kHz and 1000 kHz is observed. This causes abnormal noise to be felt.

On the other hand, by randomly shifting the time to start the acceleration period Ta for each cycle, generation of harmonics is suppressed, and noise sounding during low-speed rotation can be reduced.

(Second Control Method)

Figure 5:
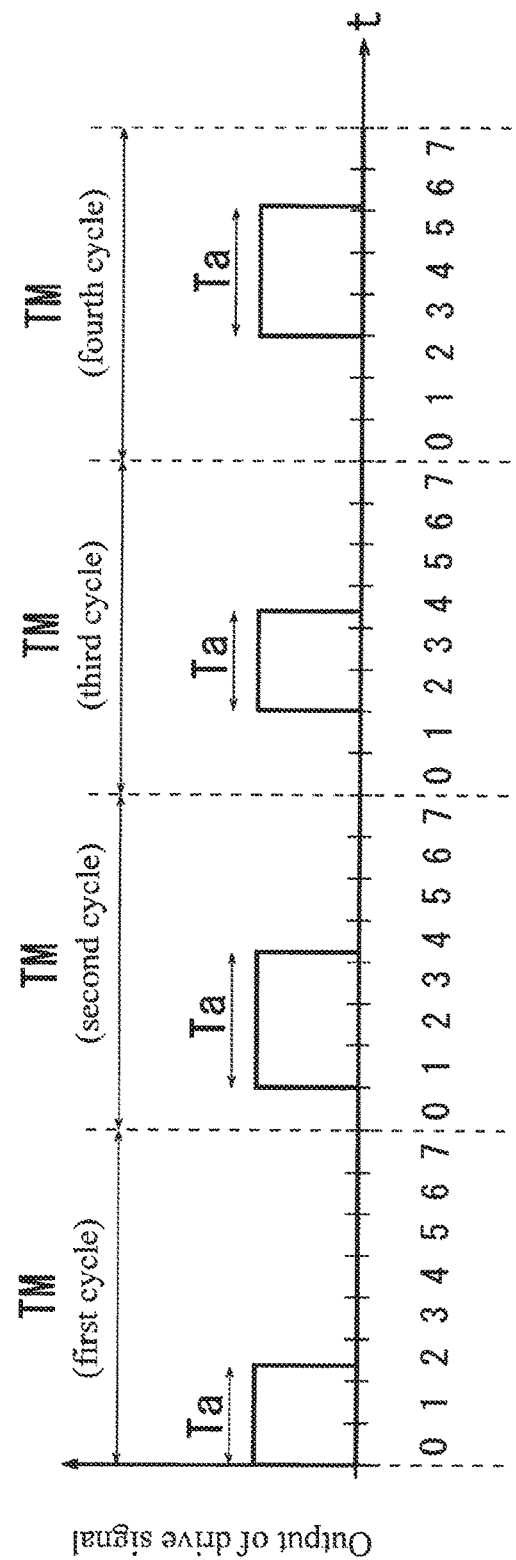
FIG. 5 is a waveform diagram of a drive signal of an ultrasonic motor according to a second control method.

FIG. 5 is a waveform diagram of a drive signal of the ultrasonic motor 5 according to a second control method. While referring to a rotation speed of the rotary shaft 6, the control unit 23 fixes the control cycles TM of the ultrasonic motor 5 based on a clock signal from the clock signal oscillation unit 63 and changes the ratio of the acceleration period Ta in each control cycle TM (the acceleration period Ta is started once in the control cycle TM). Thereafter, the control unit 23 sets 0th to k−1-th sections by dividing the control cycle TM by k (k is a natural number not less than 2), and regularly shifts the time to start the acceleration period Ta for each cycle.

As an example, in FIG. 5, 0th, 1st, 2nd, 3rd, 4th, 5th, 6th, and 7th sections are set by equally dividing the control cycle TM into the eight sections. In this case, the control unit 23 shifts the time to start the acceleration period Ta by one section for each cycle. For example, the time to start the acceleration period Ta is shifted by a predetermined time for each cycle so that the acceleration period Ta is started from the beginning of the 0th section in the first cycle, the acceleration period Ta is started from the beginning of the 1st section in the second cycle, the acceleration period Ta is started from the beginning of the 2nd section in the third cycle, and the acceleration period Ta is started from the beginning of the 3rd section in the fourth cycle. After the starting time reaches the 7th section, it may be turned back to the 6th section, or returned to the 0th section again. Alternatively, the acceleration period Ta may be started from a section other than the 0th section, or may be started at the end of a section or an intermediate point of a section.

Thus, by regularly shifting the section to start the acceleration period Ta for each cycle, the starting time of the acceleration period Ta is changed for each cycle, so that generation of harmonics can be suppressed and noise sounding during low-speed rotation can be reduced.

(Third Control Method)

Figure 6:
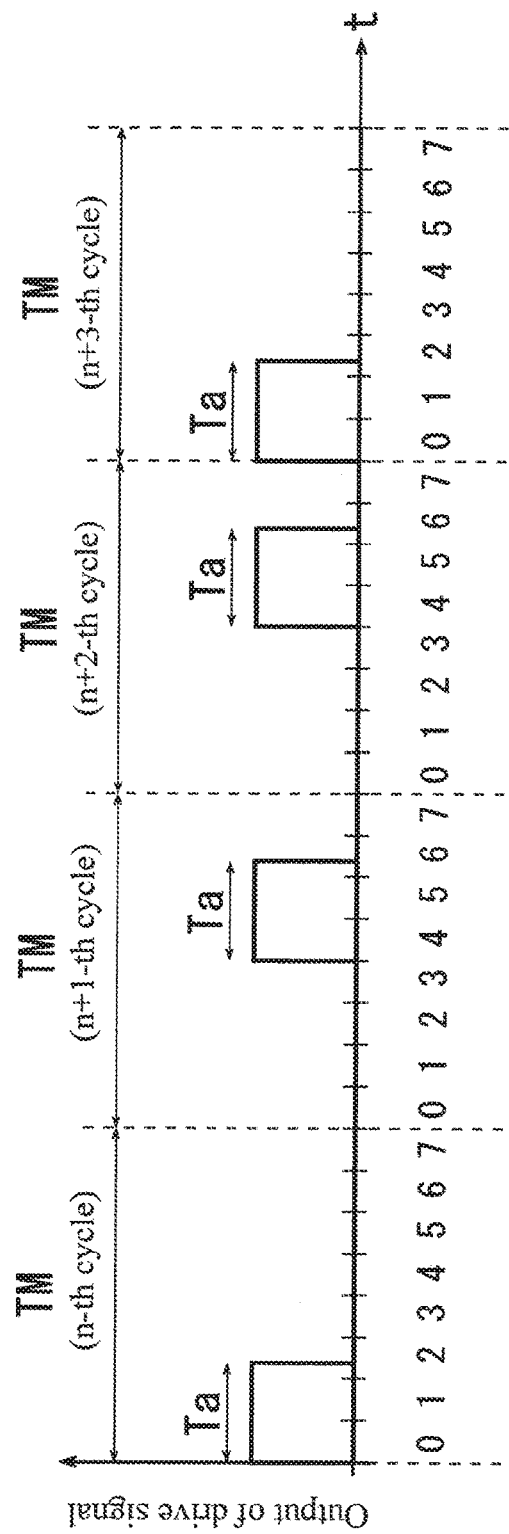
FIG. 6 is a waveform diagram of a drive signal of an ultrasonic motor according to a third control method.

FIG. 6 is a waveform diagram of a drive signal of the ultrasonic motor according to a third control method, and is another example of a method for regularly shifting the starting time of the acceleration period Ta for each cycle. The same components as in the second control method are designated by the same reference numerals, and description thereof is omitted. As shown in FIG. 5, after setting 0th to 7th sections by equally dividing the control cycle TM into the eight sections, the control unit 23 starts the acceleration period Ta from the beginning of the 0th section in the n-th cycle (n is a natural number), starts the acceleration period Ta from the beginning of the fourth section in the n+1-th cycle, starts the acceleration period Ta from the beginning of the fourth section in the n+2-th cycle, and starts the acceleration period Ta from the beginning of the 0th section in the n+3-th cycle, and repeats this process. That is, the control unit 23 regularly shifts the starting time of the acceleration period Ta to the sections |0, 4, 4, 0|0, 4, 4, 0| . . . .

The regularity shown in FIG. 6 is an example, and other than this, it is only required to make a certain rule (regularity) such as shifting to even-numbered sections such as |0, 2, 4, 6|, shifting to odd-numbered sections such as |1, 3, 5, 7|, and shifting alternately to even-numbered and odd-numbered sections such as |0, 2, 4, 6|1, 3, 5, 7| . . . , shifting by three sections, or starting from a section selected among rearranged arbitrary three sections or a combination of arbitrary three sections, etc.

Thus, even when the section to start the acceleration period Ta is regularly shifted for each cycle, the starting time of the acceleration period is changed for each period, so that generation of harmonics is suppressed, and noise sounding during low-speed rotation can be reduced.

In the example shown in FIG. 6, the interval of starting the acceleration period Ta changes periodically in such a manner that the interval is from the 0th section to the 4th section in the cycles from the n-th cycle to the n+1-th cycle, the interval is from the 4th section to the 4th section in the cycles from the n+1-th cycle to the n+2-th cycle, the interval is from the 4th section to the 0th section in the cycles from the n+2-th cycle to the n+3-th cycle, and the interval is from the 0th section to the 0th section in the cycles from the n+3-th cycle to the n+4-th cycle, so that the acceleration can be varied to increase and decrease.

As a method for regularly shifting the starting time of the acceleration period Ta for each cycle, not only the method in which the control cycle TM is divided by k but also a method in which the starting time is shifted by a predetermined time for each cycle based on a clock signal can be adopted. For example, it is also possible that by setting 1 pulse=1 μsec as a minimum unit, the starting time of the acceleration period Ta is shifted by 1 μsec for each cycle, and after the starting time reaches a terminal end of a control cycle TM, it may be turned back or returned to a starting end of a control cycle TM.

(Fourth Control Method)

Figure 7:
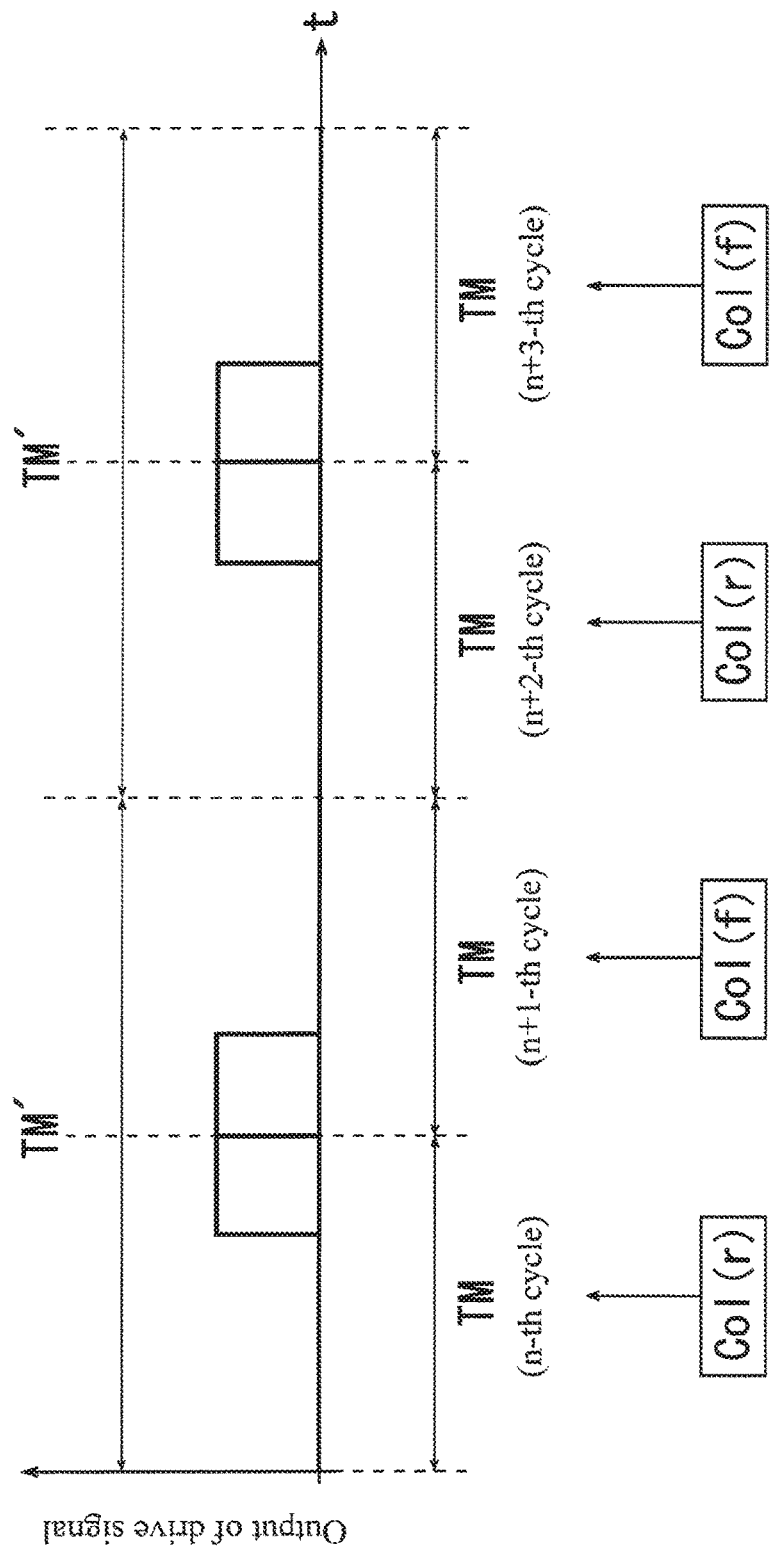
FIG. 7 is a waveform diagram of a drive signal of an ultrasonic motor according to a fourth control method.

FIG. 7 is a waveform diagram of a drive signal of the ultrasonic motor 5 according to a fourth control method. The control unit 23 fixes the control cycles TM of the ultrasonic motor 5 based on a clock signal from the clock signal oscillation unit 63, and changes a ratio of an acceleration period Ta in each control cycle TM (the acceleration period Ta is started once in one control cycle TM). Thereafter, the control unit 23 alternately repeats second-half acceleration control Col(r) to end the acceleration period Ta so that it includes a terminal end of the control cycle TM and first-half acceleration control Col(f) to start the acceleration period Ta so that it includes a starting end of the control cycle TM for each cycle.

Thus, by alternately repeating the second-half acceleration control Col(r) and the first-half acceleration control Col(f), the acceleration period Ta in the second-half acceleration control Col(r) and the acceleration period Ta in the first-half acceleration control Col(f) become successive, so that in the present embodiment, the drive signal apparently rises once in a cycle (hereinafter, referred to as an apparent cycle TM') two times as long as the control cycle TM. For example, when the control cycle TM=4 msec, one acceleration period Ta is provided in an apparent cycle TM'=8 msec. Therefore, the number of turning ON/OFF of the drive signal becomes half as many as that in the case of the control cycle TM=4 msec, and a frequency spectrum becomes 125 kHz equivalent to 8 msec of the apparent cycle TM'. Therefore, the noise sound becomes lower in frequency than in the case of 4 msec, so that unpleasant noise to the ears is significantly reduced.

In the fourth control method, the control cycle TM remains as 4 msec, so that the acceleration period Ta can be made different by the second-half acceleration control Col(r) and the first-half acceleration control Col(f). For example, when the acceleration period Ta is 1 msec in the second-half acceleration control Col(r), when it is desired to increase the rotation speed, the acceleration period Ta in the first-half acceleration control Col(f) can be changed to 1.3 msec. That is, while leaving the feedback control as it is (4 msec), the interval of the drive signal doubles (8 msec), so that noise sounding can be reduced without deteriorating the tracking performance.

The first cycle in the fourth control method may be started from the first-half acceleration control Col(f). The last cycle in the control may be ended in the second-half acceleration control Col(r).

The fourth control method can be regarded as a kind of method for "regularly shifting the starting time of the acceleration period Ta for each cycle" as the second and third control methods. In the fourth control method, when 0th to 7th sections are set by equally dividing the control cycle TM into the eight sections, the section to start the acceleration period Ta is regularly shifted for each cycle to |7, 0, 7, 0|7, 0, 7, 0| . . . . That is, the fourth control method is a method for regularly shifting the starting time of the acceleration period Ta to |k−1, 0, k−1, 0| . . . when the control cycle TM is divided by k.

Preferred embodiments and modifications are described above, and it is possible to combine the embodiments and modifications based on knowledge of a person skilled in the art. For example, the amplitude of the drive signal is fixed in the embodiments and modifications described above, however, the amplitude may be changed for each cycle. Such alteration is also included in the scope of the present invention.

DESCRIPTION OF REFERENCE NUMERALS

1 Surveying instrument
5, 12 Ultrasonic motor
6, 11 Rotary shaft
21, 22 Encoder
23 Control unit
TM Control cycle
Ta Acceleration period
Col(r) Second-half acceleration control
Col(f) First-half acceleration control

What is claimed is:

1. A method for controlling an ultrasonic motor that drives a rotary shaft of a surveying instrument in response to a drive signal generated by a digital processor-controlled drive circuit capable of generating control signals at variable frequencies, wherein in a low-speed rotation range of the ultrasonic motor the drive signal is not continuously applied to the ultrasonic motor, and the digital processor-controlled drive circuit controls a ratio of an acceleration period as a time of application of the drive signal in a control cycle, the digital processor-controlled drive circuit:
equally divides each control cycle into eight sections including 0th to 7th sections, and regularly shifts a starting time of the acceleration period for subsequent control cycles by the following steps:
the acceleration period in the n-th control cycle (wherein n is a natural number) is started from the beginning of the 0th section, the acceleration period in the n+1-th cycle is started from the beginning of the fourth section, the acceleration period in the n+2-th cycle is started from the beginning of the fourth section, and the acceleration period in the n+3-th cycle is started from the beginning of the 0th section, and this process is repeated, the starting time of the acceleration period is shifted to the sections |0, 4, 4, 0|.

2. A surveying instrument comprising:
a rotary shaft;
an ultrasonic motor that drives the rotary shaft in response to a drive signal;
an encoder that detects a rotation speed of the rotary shaft; and
a control unit including the digital processor-controlled drive circuit that executes the control method described in claim 1.

3. A surveying instrument comprising:
a rotary shaft;
an ultrasonic motor that drives the rotary shaft in response to a drive signal;
an encoder that detects a rotation speed of the rotary shaft; and
a control unit including the digital processor-controlled drive circuit that executes the control method described in claim 1.

4. A method for controlling an ultrasonic motor that drives a rotary shaft of a surveying instrument in response to a drive signal generated by a digital processor-controlled drive circuit that generates control signals at variable frequencies, wherein
in a low-speed rotation range of the ultrasonic motor the drive signal is not continuously applied to the ultrasonic motor, and the digital processor-controlled drive circuit controls a ratio of an acceleration period as a time of application of the drive signal in a control cycle, the digital processor-controlled drive circuit:
ends the acceleration period in each control cycle so that a second half of the acceleration period includes an ending time of the control cycle, and
starts the acceleration period so that a first half of the acceleration period includes a starting time of the control cycle, and
alternately repeats the aforementioned cycle of overlapping ending and starting times of subsequent control cycles with ending and starting times of the acceleration period.

5. A surveying instrument comprising:
a rotary shaft;
an ultrasonic motor that drives the rotary shaft in response to a drive signal;
an encoder including the digital processor-controlled drive circuit that detects a rotation speed of the rotary shaft; and
a control unit that executes the control method described in claim 4.

* * * * *